(12) United States Patent
Osinsky et al.

(10) Patent No.: US 7,821,019 B2
(45) Date of Patent: Oct. 26, 2010

(54) TRIPLE HETEROSTRUCTURE INCORPORATING A STRAINED ZINC OXIDE LAYER FOR EMITTING LIGHT AT HIGH TEMPERATURES

(75) Inventors: Andrei Vladimirovich Osinsky, Eden Prairie, MN (US); Jianwei Dong, Plymouth, MN (US); Mohammed Zahed Kauser, Minneapolis, MN (US); Brian James Hertog, Minneapolis, MN (US); Amir Massoud Dabiran, Chanhassen, MN (US)

(73) Assignee: SVT Associates, Inc., Eden Prairie, MN (US)

( * ) Notice: Subject to any disclaimer, the term of this patent is extended or adjusted under 35 U.S.C. 154(b) by 874 days.

(21) Appl. No.: 11/243,469

(22) Filed: Oct. 4, 2005

(65) Prior Publication Data

US 2006/0081873 A1  Apr. 20, 2006

Related U.S. Application Data

(60) Provisional application No. 60/615,625, filed on Oct. 4, 2004.

(51) Int. Cl.
*H01L 33/00* (2010.01)
(52) U.S. Cl. ............... 257/97; 257/94; 257/96; 257/E33.019
(58) Field of Classification Search ............ 257/18, 257/15, 104, 22, 13, 97, 94, 96, E33.019
See application file for complete search history.

(56) References Cited

U.S. PATENT DOCUMENTS

| | | | |
|---|---|---|---|
| 6,046,464 A * | 4/2000 | Schetzina | 257/96 |
| 6,936,188 B1 | 8/2005 | Haga | |
| 7,132,691 B1 * | 11/2006 | Tanabe et al. | 257/79 |
| 7,227,196 B2 * | 6/2007 | Burgener et al. | 257/103 |
| 2002/0014631 A1 * | 2/2002 | Iwata et al. | 257/89 |
| 2004/0094085 A1 | 5/2004 | White et al. | |
| 2004/0099876 A1 | 5/2004 | Niki et al. | |
| 2004/0227150 A1 * | 11/2004 | Nakahara | 257/103 |
| 2005/0224825 A1 * | 10/2005 | Ishizaki | 257/94 |
| 2005/0242357 A1 | 11/2005 | Uematsu et al. | |

OTHER PUBLICATIONS

Alivov, Ya. I. et al. "Fabrication and characterization of $n$-ZnO/$p$-AlGaN heterojunction light-emitting diodes on 6H-SiC substrates", *Applied Physics Letters*, vol. 83, No. 23, Dec. 8, 2003, 4719-4721.
Yu, Qing-Xuan et al. "Optical properties of ZnO/GaN heterostructure and its near-ultraviolet light-emitting diode", *Applied Physics Letters*, vol. 83, No. 23, Dec. 8, 2003, 4713-4715.
Ryu, Y.R. et al. "Fabrication of homostructural ZnO $p$-n junctions and ohmic contacts to arsenic-doped $p$-type ZnO", *Applied Physics Letters*, vol. 83, No. 19, Nov. 10, 2003, 4032-4034.

(Continued)

*Primary Examiner*—Phat X Cao
*Assistant Examiner*—Diana C Garrity
(74) *Attorney, Agent, or Firm*—Kinney & Lange, P.A.

(57) ABSTRACT

A heterostructure semiconductor device capable of emitting electromagnetic radiation and having a junction with opposite conductivity type materials on either side thereof supported on a substrate with an active layer therebetween comprising zinc oxide and having a band gap energy that is less than that of either of the opposite conductivity type materials.

18 Claims, 7 Drawing Sheets

OTHER PUBLICATIONS

Alivov, Ya.I. et al. "Observation of 430 nm electroluminescence from ZnO/GaN heterojunction light-emitting diodes", *Applied Physics Letters*, vol. 83, No. 14, Oct. 6, 2003, 2943-2945.

Aoki, T. et al. "ZnO diode fabricated by excimer-laser doping", *Applied Physics Letters*, vol. 76, No. 22, May 29, 2000, 3257-3258.

* cited by examiner

TRIPLE HETEROSTRUCTURE INCORPORATING A STRAINED ZINC OXIDE LAYER FOR EMITTING LIGHT AT HIGH TEMPERATURES

CROSS-REFERENCE TO RELATED APPLICATION

This application claims the benefit of Provisional Application No. 60/615,625 filed Oct. 4, 2004 for "HIGH TEMPERATURE LIGHT-EMITTING DIODES".

BACKGROUND OF THE INVENTION

The present invention relates to solid state electromagnetic radiation emitting devices and, more particularly, to light-emitting diodes (LEDs).

LED devices and the technology for fabricating and using them is increasingly viewed as an attractive approach for providing solid state device light emission on a scale suitable for general illumination uses. Such devices can emit light with a power efficiency greater than 50% and that accurately mimics the visible solar spectrum. As a result, the markets for general illumination and other LED uses is expected to become quite large.

LEDs that emit radiation in the blue, green and ultraviolet portions of the electromagnetic radiation spectrum can generate white light by combining them with a suitable phosphorescent material or phosphor. In use, the phosphor is optically excited by such an LED and emits over a broad range of wavelengths resulting in the appearance of white light. The phosphor is contained in a film coating either the semiconductor LED itself or in a suitable plastic encapsulating structure housing the LED.

However, LEDs presently used in such arrangements suffer substantial self heating during operation. The optical emission efficiency of direct band-to-band electron transitions, or interband transitions, leading to photon emissions occurring in the presently used GaN/InGaN quantum well and multiple quantum well devices is dramatically reduced at elevated temperatures, and large emitting area LED based lamps used for high optical power become very inefficient for temperatures over 200° C. due to difficulties with heat extraction and dissipation. The main mechanisms behind degradation of LED efficiency at elevated temperatures are thermionic emission of injected carriers out of the quantum well or multiple quantum wells before participation in the recombination process and enhancement of the non-radiative component of recombination. Therefore, additional cooling is required to be provided to maintain high efficiency operation which, in turn, increases both manufacturing and operating costs.

This obstacle could be overcome by use of materials based on zinc oxide (ZnO) in LEDs intended for large emitting area LED lamps to be employed in solid-state lighting application. The value of using such materials derives from the high excitonic binding energy of 60 meV therein which enables efficient excitonic optical transitions in ZnO to take place at elevated temperatures. The optical mechanism of transition in the ZnO active region of LEDs is annihilation of excitons. The high excitonic binding energy is expected to prevent thermal dissociation of excitons at temperatures as high as 400° C., thereby leading to the design and fabrication of solid state optical light emitters operating at fairly high temperatures without additional cooling.

Although the lack of a reliable p-type doping process for the materials involved in the formation of p-n junctions for LEDs has been a difficulty, such diodes were recently fabricated using n-type conductivity doped zinc oxide in a junction with p-type conductivity doped aluminum gallium nitride (n-ZnO/p-AlGaN) and n-ZnO/p-GaN (omitting the aluminum) in the form of a single heterostructure grown epitaxially on silicon carbide (SiC) substrates using hybrid vapor phase epitaxy combined with chemical vapor deposition. These LEDs emitted ultraviolet light at 389 and 430 nm at room temperature, respectively, and the former was shown to operate up to 500 K. Nevertheless, there is a desire to have such LEDs with higher radiative efficiency and lower internal resistance.

BRIEF SUMMARY OF THE INVENTION

The present invention provides a heterostructure semiconductor device capable of emitting electromagnetic radiation and having a junction with opposite conductivity type materials on either side thereof supported on a substrate. The substrate first supports a first carrier structure of a first conductivity type for injecting a first kind of charge carrier into an active layer structure supported thereon. The active layer structure comprises zinc oxide and that structure receives such charge carrier injections of the first carrier structure with the first carrier structure being characterized by a first band gap energy and the active layer structure being characterized by an active layer band gap energy. A further second carrier structure of a second conductivity type is supported on the active layer structure and characterized by a second band gap energy with the second carrier structure being for injecting a second kind of charge carrier into the active layer structure, the active layer band gap energy being less than either of the first and second band gap energies.

DETAILED DESCRIPTION

Figure 1A:
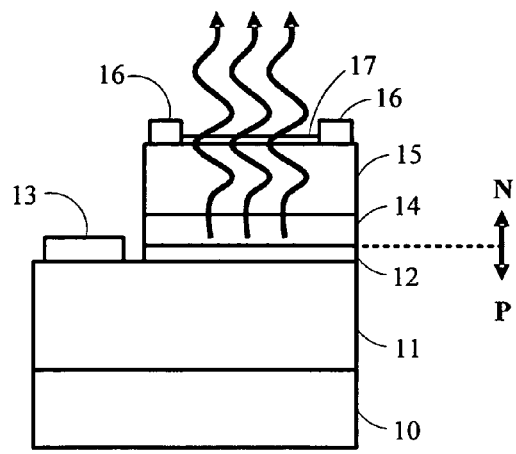
FIG. 1 shows a schematic representation of alternative embodiments of the present invention.

A semiconductor light-emitting diode, capable of emitting light in the green, blue and ultraviolet spectral ranges, is described based on n-type conductivity zinc oxide (n-ZnO) or n-type conductivity cadmium zinc oxide (n-CdZnO) layers that have internal strain due to lattice mismatch etc. being deposited over a p-type conductivity aluminum gallium nitride (p-AlGaN) layer, or a p-type conductivity aluminum indium gallium nitride (p-AlInGaN) layer, deposited on a p-type conductivity gallium nitride (p-GaN) layer forming together a p-AlGaN/p-GaN or p-AlInGaN/p-GaN p-type conductivity heterostructure. In this device structure, n-CdZnO with different Cd and Zn compositions is used as the material of the active region to produce light emission from 374 nm to 500 nm. The strained p-AlGaN/p-GaN or p-AlInGaN/p-GaN heterostructure is used for providing hole injection into the active region. The strained p-AlGaN/p-GaN or p-AlInGaN/p-GaN heterostructure having a wider band gap energy forms a hole confinement layer near the interface with the narrower band gap energy n-CdZnO or n-ZnO active region that is cladded by the n-MgZnO layer. Strained MgZnO/CdZnO layers deposited on p-type AlInGaN/p-GaN structures epitaxially form a triple heterostructure. A hole accumulation layer is formed at the interface of the strained n-CdZnO active layer, having a narrower band gap, and the p-AlInGaN layer having a wider band gap. This hole accumulation layer formed at the n-CdZnO/p-AlInGaN interface reduces parasitic lateral resistance of LED devices for temperatures up to 400° C. and higher.

Thus, the active region of the LED devices is made of a semiconductor material with high excitonic binding energy, such as ZnO, so the device can operate at high temperatures. This enables excitonic transitions to persist to very high temperatures. The device structure design enables efficient injection of holes into the ZnO active region. The hole accumulation layer near the ZnO/AlGaN interface reduces series resistance of the device at room and elevated temperatures. These ZnO/AlGaN materials based LEDs can be used in combination with the proper phosphor for white LED lamps to thereby permit use thereof for general purpose lighting.

The structures of various example embodiments of the present excitonic LED invention reflecting the foregoing are shown in FIGS. 1A, 1B, 1C and 1D. These devices are formed as a p-n junction diode (the junction being marked there with a dashed line and with oppositely directed arrows marked with P and N) with a n-ZnO (or n-CdZnO) layer active region. The n-CdZnO active region (optical recombination region) can be made with different compositions of Cd and Zn to change the band gap of the active region. As the composition of active region changes from pure ZnO (Cd=0) to pure CdO (Zn=0), the light emission wavelength will change from 377 nm to ~500 nm. The n-ZnO and n-CdZnO active regions have a narrower energy band gap than both of the wider band gap n-MgZnO layer electron emitter on one side thereof and the wider band gap p-AlGaN/p-GaN layer or p-AlInGaN/p-GaN layer hole emitter on the other side thereof The structures in these figures can have the layer materials energy gaps, that is, the gap of the n-MgZnO layer electron emitter, the gap of the n-ZnO (or n-CdZnO)-active region layer, and the gap of the p-AlGaN/p-GaN (or p-AlInGaN/p-GaN) hole emitter layer denoted as $E_{g,1}$, $E_{g,2}$, and $E_{g,3}$, respectively. Then the following design rules concerning the layers energy gaps must be met so that the energy gap of n-ZnO (or n-CdZnO) active region layer is smaller than either of the other two layers energy gaps, i. e.

$$E_{g,1} > E_{g,2} \text{ and } E_{g,2} < E_{g,3}.$$

A schematic representation of a n-MgZnO/n-ZnO/p-AlGaN/GaN LED device structure as an example of this invention is shown in FIG. 1A fabricated on a sapphire substrate, 10, although many other kinds of substrates could alternatively be used such as silicon carbide, gallium nitride, aluminum gallium nitride, etc. With sapphire, a 300 nm nucleation layer is provided thereon (not shown in FIG. 1) upon which a p-GaN layer, 11, is deposited to a thickness typically of 1 to 2 µm using plasma assisted molecular beam epitaxy, the method also used to deposit the remaining device layers. A p-$Al_{0.16}Ga_{0.84}N$ hole emitter layer, 12, to supply free holes to the triangular well near the p-n junction interface is next deposited to a thickness typically of 40 nm. This layer completes the p-type conductivity side of the p-n junction to which an electrode, 13, is shown attached at layer 11 though actually formed at a later step in the fabrication process.

The active region layer, 14, is an n-type conductivity ZnO layer that is next deposited to a thickness of typically 50 nm that has this conductivity type without need of any doping thereof. The last semiconductor layer is a 150 nm thick wide band gap energy $Mg_{0.1}Zn_{0.9}O$ electron emitter layer, 15, doped with gallium in a relatively large concentration to thereby be of $n^+$-type conductivity.

The mesa geometry vertical devices resulting from these deposited layers shown in FIG. 1 were defined using chemical and inductively-coupled plasma etching as follows. A 5% hydrofluoric (HF) aqueous solution was used to etch the MgZnO/ZnO layers 15 and 14 of the structure down to the surface of p-AlGaN layer to form 200 to 400 mm side square mesas. The p-AlGaN/GaN layers 12 and 11 structure was subsequently etched to a depth of 0.1 mm using an inductively-coupled plasma deep trench etcher to expose the p-type region of layer 11 for electrode formation. A metal electrode, 16, on n-MgZnO layer 15 and metal electrode 13 on p-GaN/AlGaN layers 12 and 11 were deposited by electron beam evaporation of Al/Ti/Au and Ni/Au, respectively. Finally, an approximately 5 nm thick aluminum layer, 17, semi-transparent to electromagnetic radiation in the green, blue and ultraviolet spectral ranges was deposited on the n-MgZnO/ZnO layers 15 and 14 mesas.

Figure 1B:
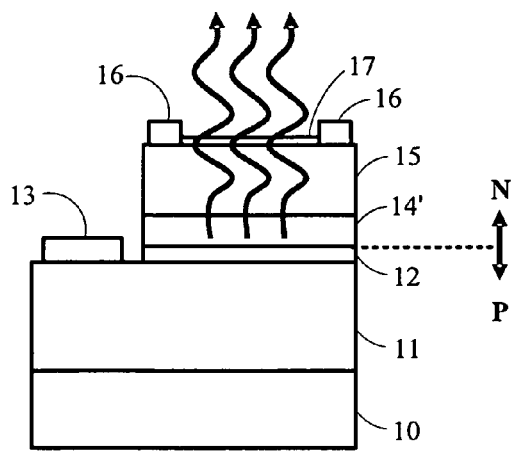

Thus, the excitonic light-emitting diode device in FIG. 1A is a p-n junction diode with an n-type conductivity, internally strained lattice ZnO active layer cladded through deposition by an n-type conductivity MgZnO layer all deposited on a p-type conductivity AlGaN/p-type conductivity GaN heterostructure. FIG. 1B is a structure like that shown in FIG. 1A but with a modified active layer, 14', into which cadmium has been introduced in the deposition step therefor to form n-type conductivity CdZnO. The addition of cadmium increases the internal lattice strain therein, so long as the layer thickness is sufficiently thin (which can be further adjusted in the choice among various well known processing step variations), and narrows the active layer energy band gap of that layer to allow changing of the wavelength of the emitted electromagnetic radiation as indicated above. In addition, with either of active layers 14 and 14' in FIG. 1A or 1B, the magnesium content in cladding layer 15 can be varied from zero to about 35% to change the degree of quantum confinement of the charge carriers therein near the interface with active layer 14 to allow various device performance trade offs involving radiative efficiency.

Figure 1C:
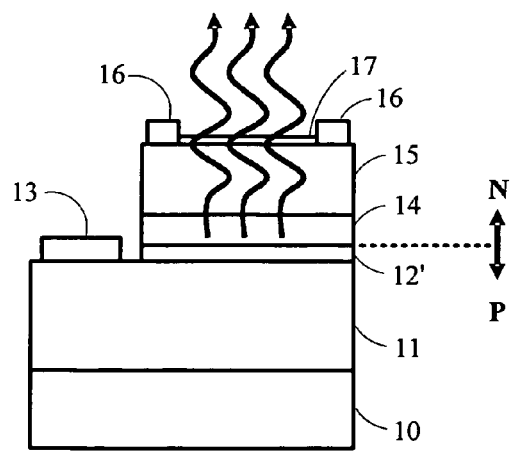
Figure 1D:
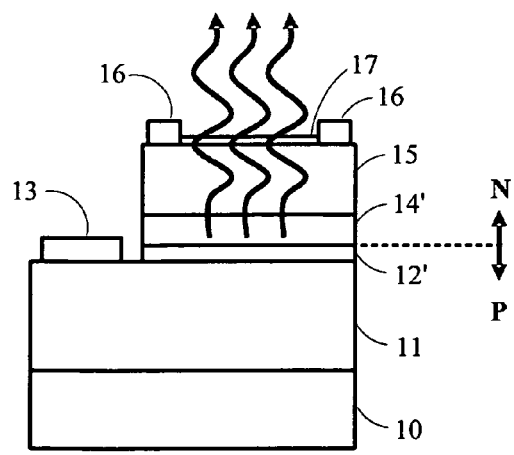

FIG. 1C corresponds to FIG. 1A, and FIG. 1D corresponds to FIG. 1B, but with the structures of FIGS. 1C and 1D having a modified hole confinement layer, 12', based on the addition of indium thereto thereby allowing changing the internal strain in the lattice thereof and the band gap energy thereof. Again, this changes the degree of quantum confinement of the charge carriers changing the internal strain in the lattice thereof and the band gap energy thereof. Again, this changes the degree of quantum confinement of the charge carriers therein near the interface with active layer 14 to provide various device performance trade offs involving radiative efficiency. In addition, the aluminum content in layers 12 or 12' can also be changed from zero to around 50% to also achieve such results for these purposes.

A basis for understanding the performance of the devices of FIG. 1 is provided by simulating the performance of the device of FIG. 1A. First, however, the room temperature band structures of various MgZnO/AlGaN/GaN heterojunctions were simulated using a self-consistent one-dimensional Schrödinger-Poisson solver.

Ga(Al)-polarity GaN and AlGaN layers were assumed for the model. The ZnO layer over AlGaN was assumed to be Zn-terminated based on growth conditions and as determined by chemical etching rates. Material parameters used for the calculation are listed in Table I below.

TABLE 1

| Wurtzite | $Al_xGa_{1-x}N$ | $Mg_xZn_{1-x}O$ |
|---|---|---|
| $E_g(x)$ (eV) | $6.2x + 3.4(1 - x) - x(1 - x)1.0^a$ | $3.37 + 1.515x^i$ |
| $E_r(x)$ | $8.9 - 0.4x^b$ | $8.10^j$ |
| $E_a(x)$ (meV) | $170 + 704x^c$ | — |
| $E_d(x)$ (meV) | $20^a$ | $50^k$ |
| $m_e^*(x)$ | $0.22 + 0.26x^d$ | $0.24^l$ |
| $m_{hh}^* = m_{lh}^*(x)$ | $1.76 + 1.77x^e$ | $0.78^j$ |
| $\Delta E_C(x)$ (eV) | $0.75\{E_g(x) - E_g(0)\}^f$ | $0.65\{E_g(x) - E_g(0)\}^f$ |
| $a_0(x)$ (Å) | $3.189 - 0.0177x^g$ | $3.24 + 0.0757x^i$ |
| $c_0(x)$ (Å) | $5.189 - 0.203x^g$ | $5.21 - 0.136x^i$ |
| $e_{33}(x)$ (C/m²) | $0.73 + 0.73x^g$ | $1.2$ $(x = 0)^m$ |
| $e_{31}(x)$ (C/m²) | $0.49 - 0.11x^g$ | $-0.51$ $(x = 0)^m$ |
| $C_{13}(x)$ (Gpa) | $106 + 2x^h$ | $104.4$ $(x = 0)^n$ |
| $C_{33}(x)$ (Gpa) | $398 - 25x^h$ | $216$ $(x = 0)^n$ |
| $P_{SP}(C/m^2)$ | $-0.029 - 0.052x^g$ | $-0.05$ $(x = 0)^m$ |

In the case of $Mg_xZn_{1-x}O$ the electron effective mass, hole effective masses, dielectric constants and donor activation energy were assumed to have the same values as those of ZnO. The band alignment of ZnO and GaN is taken to be type-II with the valance band minimum (VBM) of GaN~1 eV above that of ZnO. Based on this, a type-II band alignment was assumed for ZnO/AlGaN. The AlGaN VBM was assumed to be located above ZnO by $\sim\{1-\Delta E_V(Al_xGa_{1-x}N)\}$ eV. To account for the polar nature of the materials, both piezoelectric and spontaneous polarization effects were incorporated into the model. The polarization charge at the AlGaN/GaN and ZnO/AlGaN interfaces were calculated based on a known model. The GaN layer was assumed to be relaxed because of its thickness while the AlGaN layer was assumed to be partially relaxed because its thickness (400 Å) is greater than the AlGaN critical thickness of ~220 Å for Al mole fraction of 16%.

Thus, the AlGaN layer is in a state of in-plane tensile strain of $1.95 \times 10^{-3}$ due to lattice mismatch and as a result the piezoelectric polarization adds to the spontaneous polarization. From the relation, $$\sigma(P_{SP}+P_{PE})=\{P_{SP}(\text{bottom})+P_{PE}(\text{bottom})\}-\{P_{SP}(\text{top})+P_{PE}(\text{top}),$$

the polarization charge at the interface can be calculated. For an Al mole fraction of x=0.16, the preceding equation gives a net positive polarization charge $\sigma_{AlGan}=7\times10^{12}$ cm$^{-2}$. The ZnO layer grown on the AlGaN was also assumed to be partially relaxed. Calculation shows that the ZnO is under compressive in-plane strain of magnitude $8.9\times10^{-3}$ and that the piezoelectric and spontaneous polarizations are aligned in opposite directions. Using the preceding equation, the net difference in polarization between the AlGaN and ZnO layers is $\sigma_{Zno}=-6\times10^{12}$ cm$^{-2}$. The strain inside the MgZnO layer was assumed negligible, as was the spontaneous polarization mismatch at the MgZnO/ZnO interface.

Figure 2A:
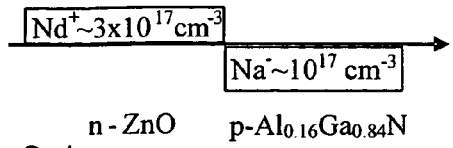
FIG. 2 shows graphs with plots comparing the present invention and previous structures provided for the same purposes.
Figure 2C:
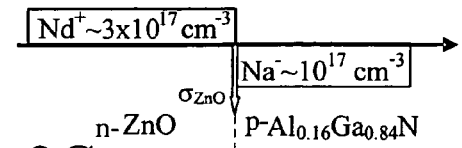
Figure 2B:
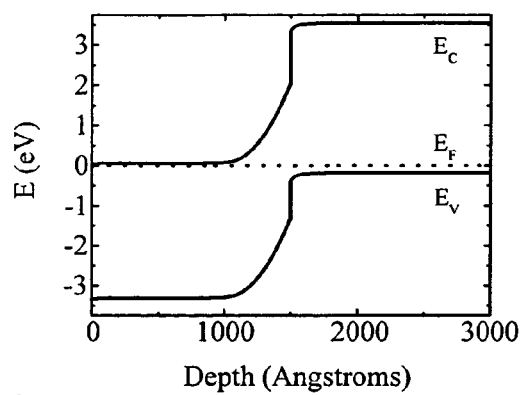

FIG. 2A shows the dopant distribution versus depth from the upper surface of active layer 14 and FIG. 2B therebelow shows the band diagram for a ZnO/$Al_{0.16}Ga_{0.84}$N heterostructure in the absence of polarization effects. Each layer was assumed to be 150 nm thick with free carrier electron and hole concentrations of about $3\times10^{17}$ cm$^{-3}$ and $10^{17}$ cm$^{-3}$, respectively. This latter figure shows the band alignment to be type-II with $\Delta E_V \approx 0.9$ eV. This approach, however, oversimplifies the physical nature of the structure leading to imprecise results.

Figure 2D:
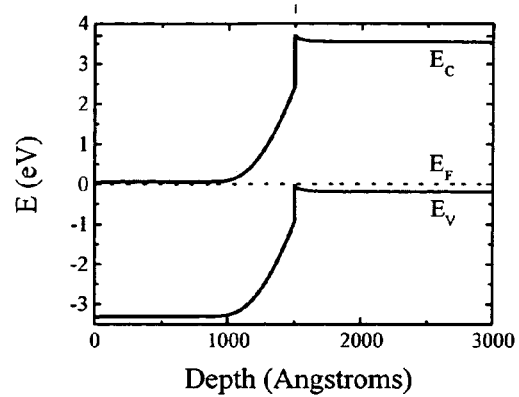

FIG. 2C shows the same dopant distribution versus depth from the upper surface of active layer 14 as was shown in FIG. 2A but by incorporating the negative polarization charge $\sigma_{ZnO}$ at the interface, the alternative simulated energy band structure shown in FIG. 2D was determined. This energy band structure reveals the presence of a hole accumulation layer at the type-II ZnO/AlGaN interface due to the strong polarization effects. This layer helps the radiative recombination process in ZnO near the interface under forward bias.

Figure 3A:
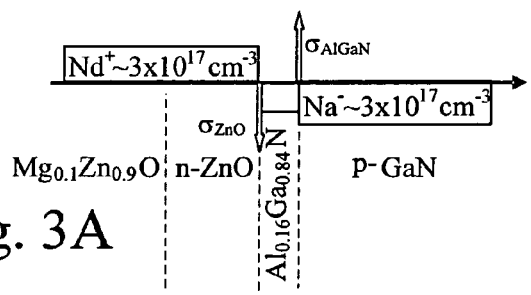
FIG. 3 shows a graph with plots characterizing the present invention.
Figure 3B:
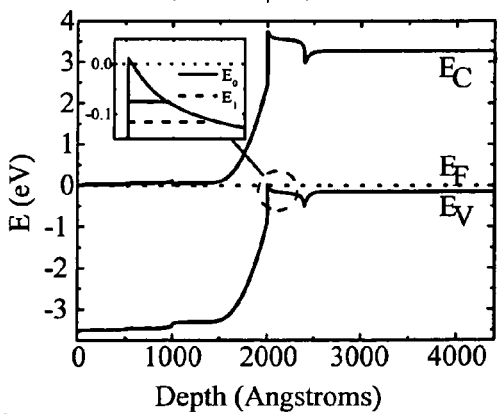

The band structure of the MgZnO/ZnO/AlGaN/GaN triple heterostructure device of FIG. 1A is shown in FIG. 3. This heterostructure contains type-II and type-I heterojunctions. The GaN layer contributes $a+\sigma_{AlGaN}$ charge resulting in the formation of a triangular quantum well (shown in the inset) near the ZnO/AlGaN interface with quantized energy levels. The ground state and first excited state lie at $E_0=-75.1$ meV and $E_1=-115.4$ meV, respectively. The quantum well leads to strong hole confinement near the ZnO/AlGaN interface which, in turn, increases the probability of radiative recombination under forward bias.

Figure 4:
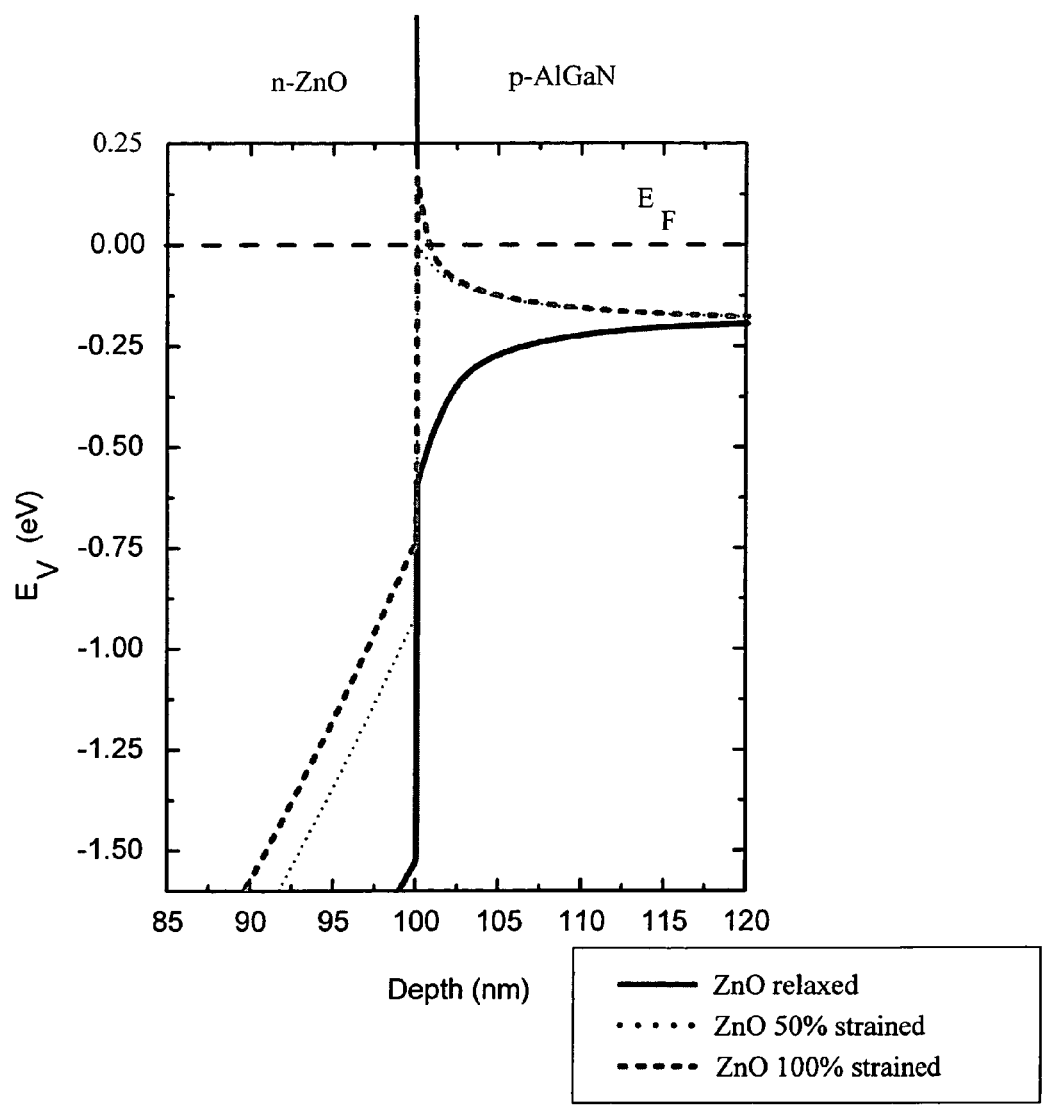
FIG. 4 shows a graph with plots characterizing the present invention.

FIG. 4 shows simulated energy band diagrams of the valance band for relaxed, partially strained and strained ZnO layers deposited on strained p-AlGaN. The sheet concentration of holes at the ZnO/AlGaN interface depends on the state of the ZnO and AlGaN layers. The total charge at interface and sheet hole density values for relaxed, partially strained and strained ZnO and AlGaN are summarized in Table 2 below.

TABLE 2

|  |  | AlGaN relaxed | AlGaN 50% strained | AlGaN totally strained |
|---|---|---|---|---|
| ZnO relaxed | (cm$^{-2}$) | $5.99 \times 10^{12}$ | $4.53 \times 10^{12}$ | $3.11 \times 10^{12}$ |
|  | Ps (cm$^{-2}$) | $3.78 \times 10^9$ | $5.38 \times 10^9$ | $7.34 \times 10^9$ |
| ZnO 50% strained | (cm$^{-2}$) | $-5.8 \times 10^{12}$ | $-5.74 \times 10^{12}$ | $-5.64 \times 10^{12}$ |
|  | Ps (cm$^{-2}$) | $3.1 \times 10^{12}$ | $3.02 \times 10^{12}$ | $2.91 \times 10^{12}$ |
| ZnO totally strained | (cm$^{-2}$) | $-1.74 \times 10^{13}$ | $-1.58 \times 10^{13}$ | $-1.43 \times 10^{13}$ |
|  | Ps (cm$^{-2}$) | $1.73 \times 10^{13}$ | $1.54 \times 10^{13}$ | $1.35 \times 10^{13}$ |

Introduction of the MgZnO/ZnO heterojunction provides an additional confinement for electrons injected into the n-ZnO active region at forward bias.

The electrical current under forward bias of the p-n junction in the LED leads to injection of electrons from n-type MgZnO and holes from either p-type AlGaN or p-type AlInGaN into the active region of the LED structure. As a result of the recombination of electrons and holes in the active region, the active region emits light. A typical emission wavelength of the active region of the p-n junction diode is the blue range of the visible spectrum.

The hole accumulation layer formed at the active layer 14 and hole emitter layer 12 or 12' interface in the devices of FIG. 1 acts as a current spreading layer, where the current propagates in the plane of the hole accumulation channel. This reduces parasitic lateral resistance of these LED devices at temperatures up to 400° C. thereby aiding in providing the LED with the ability to operate at high temperature.

The characteristics of fabricated MgZnO/ZnO/AlGaN/GaN-based p-n light-emitting diodes were measured at the wafer level using standard electrical and optical characterization methods. The measurements were conducted in the temperature range 300K-650K for LEDs operating in pulsed and CW modes. The energy band diagram of the fabricated FIG. 1A type device is essentially the same as that shown in FIG. 3.

Figure 5:
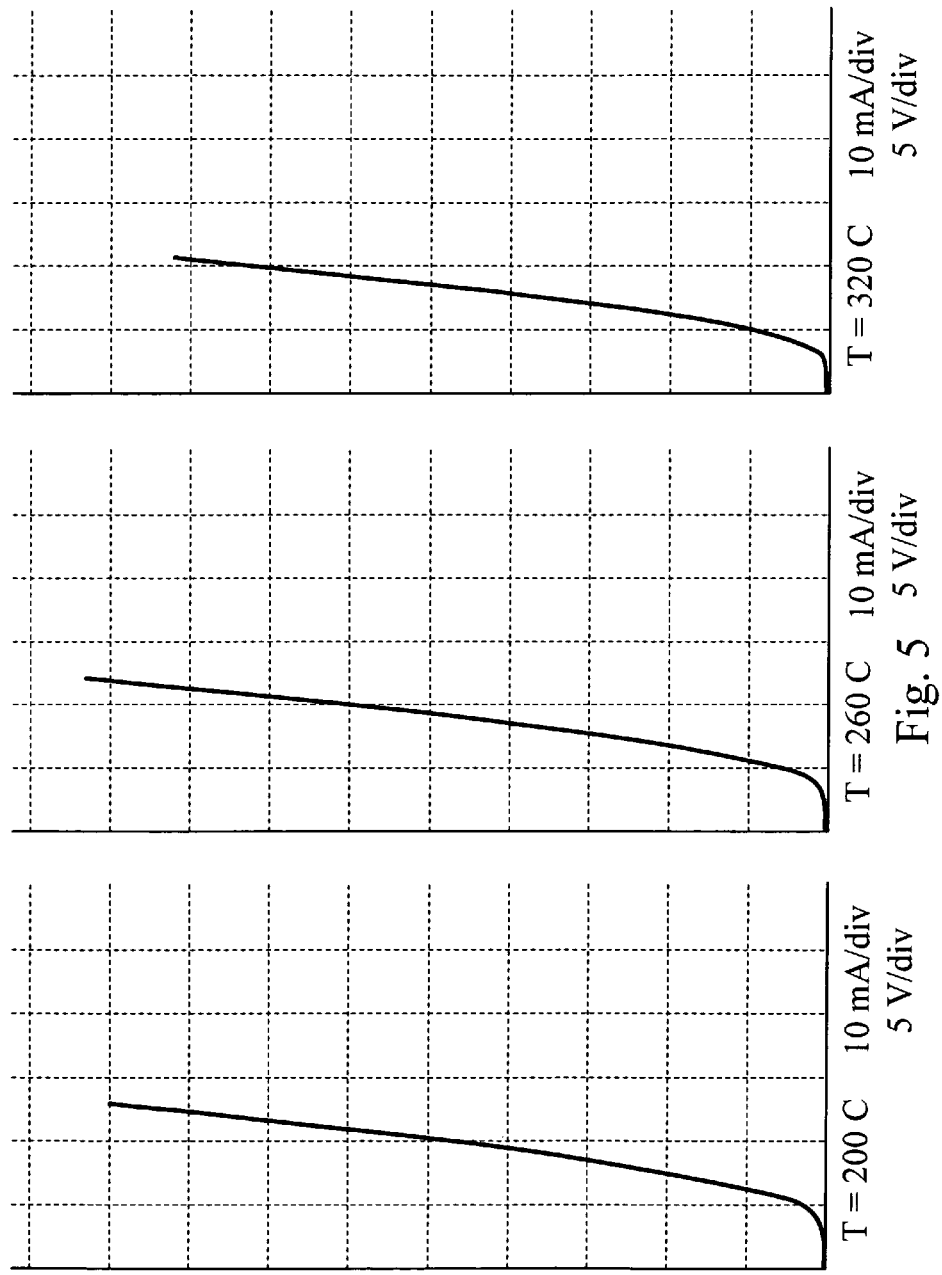
FIG. 5 shows a graph with plots characterizing the present invention.

FIG. 5 shows typical I-V characteristics of forward biased MgZnO/ZnO/AlGaN/GaN triple heterostructure LED devices emitting in the ultraviolet spectral region measured at temperatures near 480K, 540K and 600K. The turn on voltage for these devices was ~3.2-3.5V consistent with the ZnO bandgap. Rectifying I-V characteristics similar to those shown in FIG. 5 were observed up to 680K. The temperature range of the measurements was limited by the equipment used in the experiments and not by the device properties. Differential resistance was ~50-100 Ohm in the temperature range of 400K to 650K. The access resistance of the bottom p-GaN layer determines the series resistance of these LEDs. Thermal activation of the acceptors at elevated temperatures reduces the device series resistance. The series resistance decreased from ~250 Ohm to ~120 Ohm as the temperature was increased from 400K to 650K. A soft reverse bias breakdown was observed at ~15V.

Figure 6B:
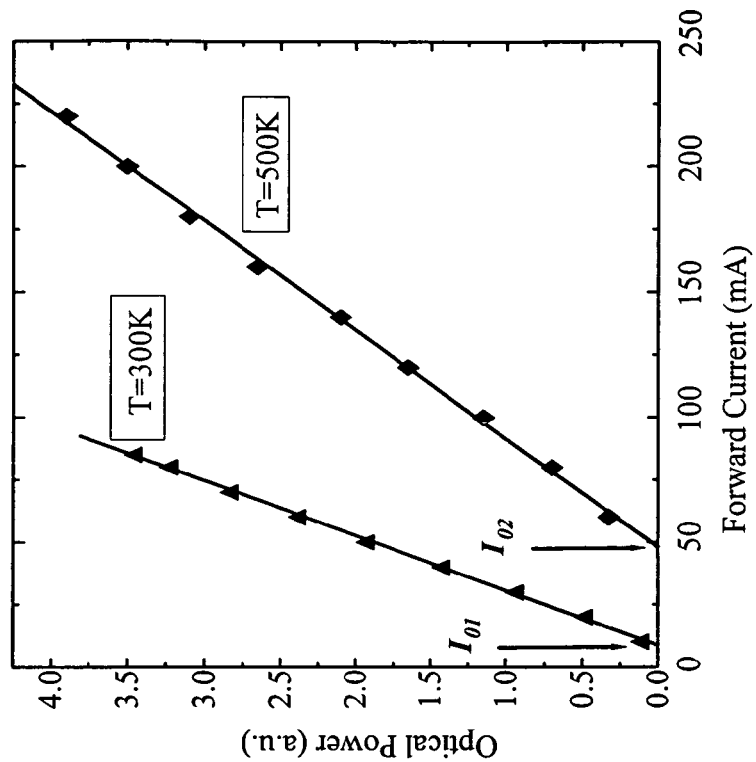
FIG. 6 shows a graph with plots characterizing the present invention.
Figure 6A:
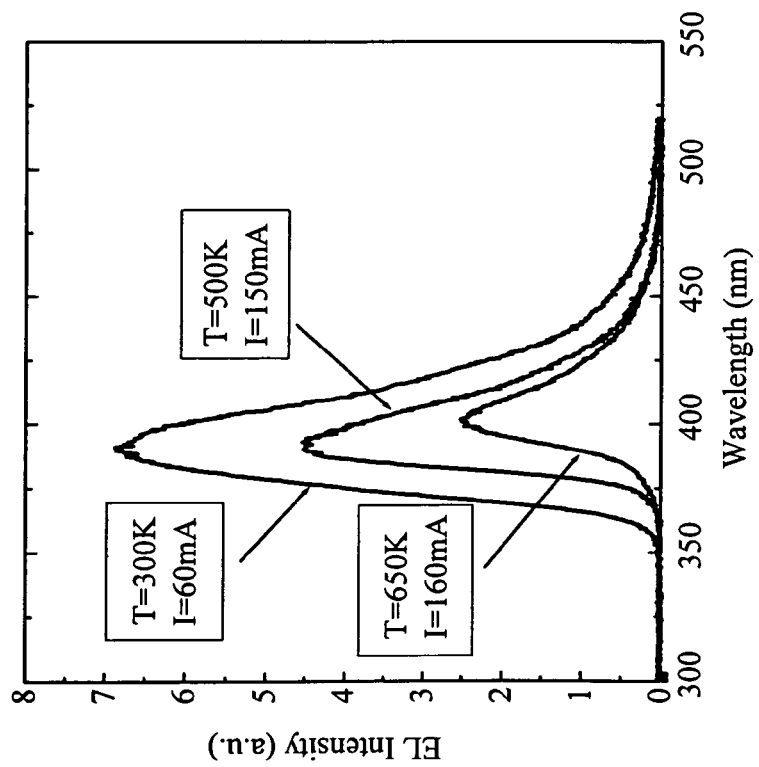

Electroluminescence spectra measured at different temperatures and driving currents are shown in FIG. 6A. The emission band originates from the near interband transition in the ZnO active region near the p-AlGaN interface. The free or bound excitonic character of the optical transitions in these structures was confirmed by the optical transmission and photocurrent spectra. As can be seen from FIG. 6A the peak position of the emission band red-shifts from 390 nm to 401 nm as the temperature increases from 300K to 650K. The full width at half maximum of the spectra also narrows from 40 nm to 28 nm over the same temperature range. Broadening of the optical emission band measured at room temperature may possibly be due to strain variation in the ZnO active region. Another possible mechanism for broadening is recombinations associated with optical transitions through different energy states localized in the triangular quantum well of the valence band (see the inset in FIG. 3B). FIG. 6B shows the integrated optical emission power from the LEDs as a function of applied current. Optical emission from the LEDs was observed up to 680K, the upper temperature limit of the measurement system.

Optical emission power of these LEDs is linearly proportional to the forward current as shown in FIG. 6B. The dependence remains linear at high currents. FIG. 6B shows that the threshold for light emission occurs at $I_{o1}$=7.8 mA at 300K and $I_{o2}$=48 mA at 500K. The observed optical emission threshold can be explained in terms of a nonradiative recombination mechanism present at the ZnO/AlGaN interface that is assumed to dominate at low injection currents. This nonradiative recombination process increases with temperature, resulting in an increase of the optical emission threshold current to 48 mA at 500K.

The absolute optical power measured at room temperature from a test device mounted on a header was ~10 mW. At 650K a maximum pulsed current of 380 mA was applied to a test UV LED. The pulse width used for this experiment was 200 ms, which also contributed to the heating. A significant red shift to 409 nm of the peak emission was observed for these LEDs operated at 300 mA at a temperature of 650K. This red shift suggests that there is significant internal heating of the active region.

There are many modifications possible to this invention that do not violate the spirit of the invention. For example, the composition of the p-AlGaN and n-MgZnO layers can be continuously graded from one layer to the adjacent layer. Such grading is known to reduce the electrical resistance of LEDs. Furthermore, the top contact geometry can have many different shapes, for example a cross-shaped contact, a circular contact, or another contact shape. Other known methods may be used to reduce the p-type GaN resistance, for example, superlattices may be used to reduce the resistance of the p-type layers.

Figure 7A:
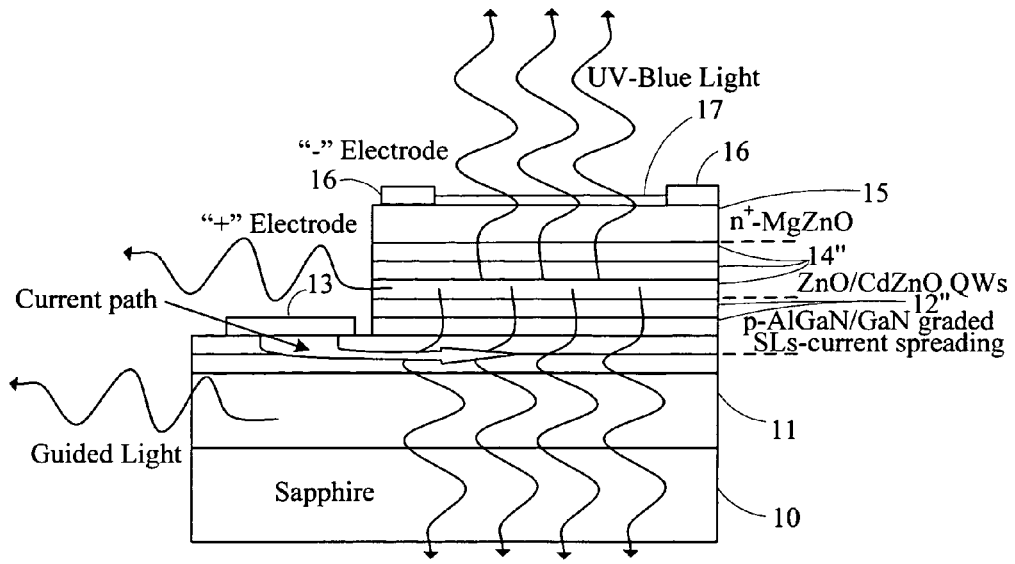
FIGS. 7A, 7B and 8 show schematic representations of further alternative embodiments of the present invention.
Figure 7B:
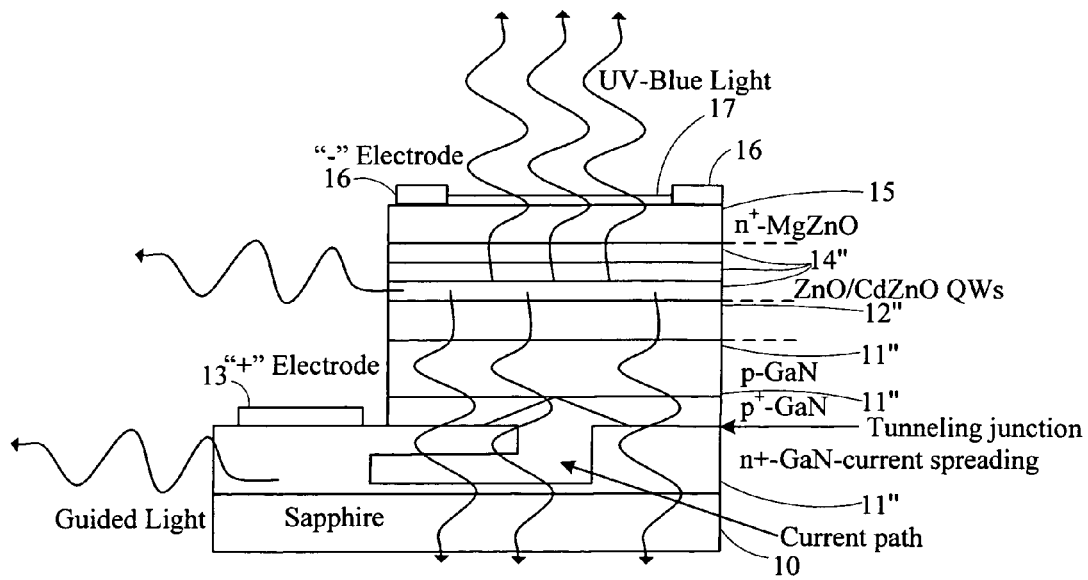
Figure 8:
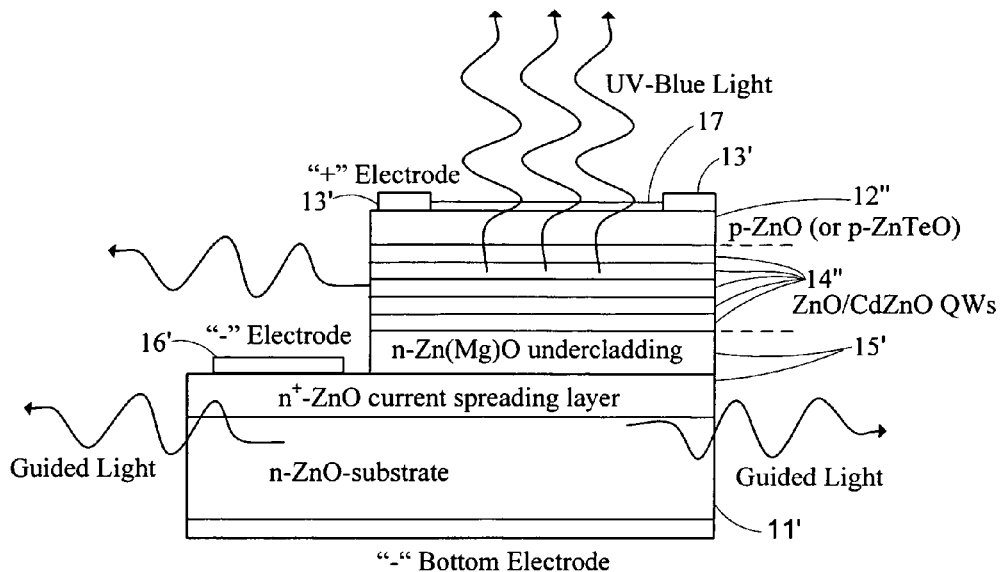

Thus, also as part of the present invention, is the use ZnO/CdZnO multiple quantum wells (MQWs) or superlattices (SLs) as active layers of the LEDs provided on GaN/sapphire substrates 11, or on ZnO bulk substrates, 11'. The structures shown in FIGS. 7 and 8 represent various embodiments of such LEDs based on MQW active regions. Schematic structural representations of two different hybrid CdZnO/ZnO MQW-based LED structures are shown in FIGS. 7A and 7B. The LED shown in FIG. 7A uses p-AlGaN/GaN graded superlattices to provide efficient lateral current spreading and to serve as the bottom hole injecting electrode, 12". The second, in FIG. 7B, employs also a n++-GaN/p++-GaN low resistance tunneling junction as part of the bottom hole injector, 11". This latter configuration enables efficient lateral current spreading. The active region for both LED structures shown in FIG. 7 is formed by ZnO/CdZnO Qws, 14", followed by wide band gap n+-MgZnO electron confinement layer 15.

The all-ZnO structure of FIG. 8 uses an active region 14" based on ZnO/CdZnO QWs similar to the ones in the hybrid LEDs shown in FIG. 7, but here provided in electron injector, 15', capped with a hole injector 12". The structure is on ZnO substrate 11'. The use of the highly conductive substrates as well as the vertical design eliminates problems with current spreading in this structure, leading to uniform current injection. Utilization of the bottom and side "−" electrodes are both part of the LED shown. The side "−" electrode may not be required for this structure if ZnO is conductive enough.

Figure 9:
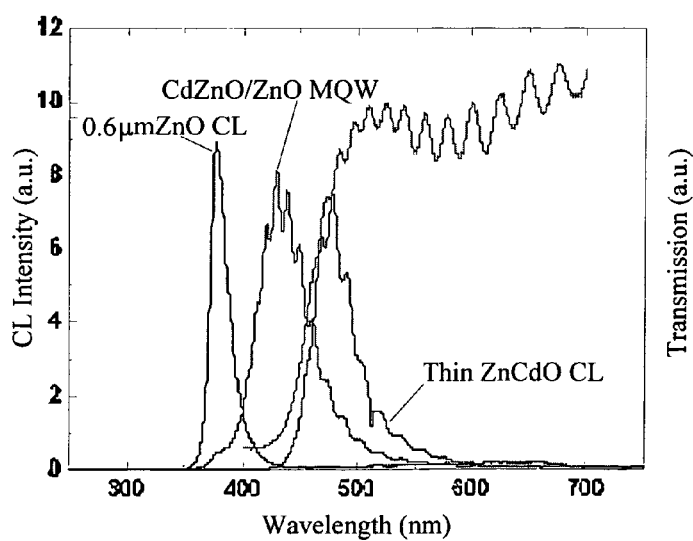
FIG. 9 shows a graph with plots further characterizing the present invention.

FIG. 9 shows the cathodoluminesence (CL) spectra from a single layer of CdZnO, CdZnO/ZnO MQWs having CdZnO quantum wells with compositions similar to that of the single layer, and a ZnO film similar to that used for the barriers of the MQW. Strong quantum confinement in the wells produces an approximate 50 nm blue spectral shift which leads to an observed color change from turquoise to violet. The transmission spectrum shown in FIG. 9 is from the same CdZnO single layer used for the CL. The position of the transmission spectra with respect to the CL confirms the interband character of the optical transition. A Stokes shift is observed. The periodic oscillations seen in the transmission and CL spectra correspond to thin film interference and is a sign of the high optical quality of the surfaces and interfaces.

Although the present invention has been described with reference to preferred embodiments, workers skilled in the art will recognize that changes may be made in form and detail without departing from the spirit and scope of the invention.

The invention claimed is:

1. A heterostructure semiconductor device capable of emitting electromagnetic radiation and having a junction with opposite conductivity type materials on either side thereof, said device comprising:

a substrate supporting a heterostructure arrangement, said heterostructure arrangement comprising:

an active layer structure having two major surfaces on opposite sides thereof characterized by an active layer band gap energy, and comprised of a selected one or more of zinc oxide, cadmium oxide and cadmium zinc oxide;

a first carrier structure of p-type conductivity directly against one of said active layer structure major surfaces for injecting a first kind of charge carrier into said active layer structure with said first carrier structure being characterized by a first band gap energy and formed of at least two strata comprising p-type conductivity gallium nitride in a first strata and p-type conductivity aluminum gallium nitride in a second strata that is nearer said active layer structure than said first strata which has said substrate on an opposite side thereof so as to be free of any material containing zinc therebetween; and a second carrier structure of n-type conductivity directly against that remaining one of said active layer structure major surfaces for injecting a second kind of charge carrier into said active layer structure with said second carrier structure being characterized by a second band gap energy, said active layer band gap energy being less than either of said first and second band gap energies.

2. The device of claim 1 wherein said second carrier structure is comprised of a selected one of zinc oxide and n-type conductivity magnesium zinc oxide having therein a selected composition of magnesium from near zero to thirty-five percent.

3. The device of claim 1 wherein said second strata also has indium provided therein.

4. The device of claim 1 wherein said second strata has therein a selected composition of aluminum from near zero to fifty percent.

5. The device of claim 1 further comprising said active layer structure being formed as a superlattice in a sequence of layers having layers of zinc oxide and cadmium zinc oxide in alternating positions therein.

6. The device of claim 1 further comprising a phosphor film positioned near or on said heterostructure semiconductor device.

7. The device of claim 2 wherein the magnesium composition in said magnesium zinc oxide in said second carrier structure is graded from that edge thereof at said active layer structure from matching a composition in said active layer structure to a selected greater value.

8. The device of claim 5 further comprising said second strata being formed as a superlattice in a sequence of layers having layers of p-type conductivity gallium nitride and p-type conductivity aluminum gallium nitride in alternating positions therein.

9. The device of claim 5 further comprising a tunneling juncture structure positioned between said substrate and said heterostructure arrangement and formed of two layers comprising p+-type conductivity gallium nitride in a first layer and n+-type conductivity aluminum gallium nitride in a second layer.

10. The device of claim 8 wherein the aluminum composition in said aluminum gallium nitride in said second strata is graded from that edge thereof at said first strata from matching a composition in said first strata to a selected greater value.

11. The device of claim 1 wherein said active layer structure and said second strata together form a n-type conductivity zinc oxide and a p-type conductivity aluminum gallium nitride heterojunction with type II band alignment.

12. The device of claim 11 wherein said active layer structure has a lattice mismatch based compressive strain therein to an extent set by that lattice mismatch resulting from a selected concentration of cadmium in said active layer structure and by a selected concentration of aluminum in said second strata.

13. The device of claim 11 wherein said active layer structure has spontaneous and lattice mismatch based piezoelectric polarizations thereof aligned in opposite directions.

14. The device of claim 12 wherein said second strata has a tensile strain therein due to lattice mismatches with said active layer structure and said first strata to result in a triangular quantum well occurring in said second strata at and immediately adjacent to said active layer structure.

15. A heterostructure semiconductor device capable of emitting electromagnetic radiation and having a junction with opposite conductivity type materials on either side thereof, said device comprising:

a substrate supporting a heterostructure arrangement, said heterostructure arrangement comprising:

an active layer structure having two major surfaces on opposite sides thereof characterized by an active layer band gap energy, and comprised of a selected one or more of zinc oxide, cadmium oxide and cadmium zinc oxide;

a first carrier structure of p-type conductivity directly against one of said active layer structure major surfaces for injecting a first kind of charge carrier into said active layer structure with said first carrier structure being characterized by a first band gap energy and formed of at least one strata comprising a p-type conductivity semiconductor material such that said active layer structure and said strata form a heterojunction with a type II band alignment; and a second carrier structure of n-type conductivity directly against that remaining one of said active layer structure major surfaces for injecting a second kind of charge carrier into said active layer structure with said second carrier structure being characterized by a second band gap energy, said active layer band gap energy being less than either of said first and second band gap energies.

16. The device of claim 15 wherein said active layer structure has a lattice mismatch based compressive strain therein to an extent set by that lattice mismatch resulting from a selected concentration of cadmium in said active layer structure and by a selected concentration of aluminum in said strata.

17. The device of claim 16 wherein said active layer structure has spontaneous and lattice mismatch based piezoelectric polarizations thereof aligned in opposite directions.

18. The device of claim 16 wherein said strata has a tensile strain therein due to lattice mismatch with said active layer structure to result in a triangular quantum well occurring in said strata at and immediately adjacent to said active layer structure.

* * * * *